United States Patent [19]
Obata et al.

[11] Patent Number: 5,112,262
[45] Date of Patent: May 12, 1992

[54] APPARATUS AND METHOD FOR ELECTRICAL CONNECTIONS OF A DISPLAY DEVICE

[75] Inventors: Masao Obata, Nara; Masaki Arima, Yamatokoriyama; Kouki Taniguchi, Osaka, all of Japan

[73] Assignee: Sharp Kabushiki Kaisha, Osaka, Japan

[21] Appl. No.: 492,915

[22] Filed: Mar. 13, 1990

[30] Foreign Application Priority Data

Mar. 15, 1989 [JP] Japan ................................. 1-64161

[51] Int. Cl.⁵ .............................................. H05K 3/32
[52] U.S. Cl. ...................................... 445/24; 156/152
[58] Field of Search ..................... 156/94, 152; 445/24, 445/25, 2

[56] References Cited

U.S. PATENT DOCUMENTS

| | | | |
|---|---|---|---|
| 4,295,711 | 10/1981 | Tanaka et al. | 350/334 |
| 4,304,450 | 12/1981 | Bilsback et al. | 445/2 |
| 4,640,581 | 2/1987 | Nakanowatari et al. | 350/331 R |
| 4,650,434 | 3/1987 | Deschamps et al. | 445/24 X |

FOREIGN PATENT DOCUMENTS

| | | |
|---|---|---|
| 0110382 | 6/1984 | European Pat. Off. |
| 0140619 | 5/1985 | European Pat. Off. |
| 0267688 | 5/1988 | European Pat. Off. |

*Primary Examiner*—Kenneth J. Ramsey

[57] ABSTRACT

In a displaying cell of a liquid crystal display device, glass substrates are formed to overhang a displaying area and electrodes formed on the glass substrates are also formed to overhang the displaying area. An electrode formed on a wiring substrate, in which integrated circuit chips are mounted in order to drive the electrodes, is connected by an anistotropic conductive film to the electrodes on the glass substrates. Space is provided on the glass substrates, so that another anisotropic conductive film can be provided between the attaching position of the anisotropic conductive film and the displaying area. In the event that a connection is disconnected, a wire is broken or the current leaks, the wiring substrates are peeled off, and the connection is repaired. After repair, the wiring substrate is connected to a different part of the electrode on the glass sbstrate.

18 Claims, 3 Drawing Sheets

APPARATUS AND METHOD FOR ELECTRICAL CONNECTIONS OF A DISPLAY DEVICE

BACKGROUND OF THE INVENTION

1. Field of the Invention

The present invention relates to a method for wiring connections in a liquid crystal display device and structure for wiring connections to be used therefor.

2. Description of the Prior Art

FIG. 1 is a partially enlarged plane view showing a wiring connection structure in which an electrode 5 formed on a film-like printed circuit substrate 4 as a tape carrier (Tape automated bonding; hereinafter merely called "TAB") and a flexible printed circuit substrate (hereinafter merely called "FPC") is connected to another electrode 3 formed at a substrate 2a at the side of a displaying cell 1 of a liquid crystal display device.

In FIG. 1, the electrode 3 on one substrate 2a which is formed as to be partially overhung from the displaying area A of the displaying cell 1 is for example a common electrode, and a segment electrode (not illustrated) is formed at another substrate 2b so arranged as to be confronted through a liquid crystal layer (not illustrated) to the substrate 2a. An anisotropic conductive film 6 is adhered to the intermediate position on the surface of the portion overhung from the displaying area A of the substrate 2a that it can be intercrossed with the electrode 3. The film-like printed circuit substrate 4 is laminated so as to secure the matching between the electrode 5 and the electrode 3 on the substrate 2a therefrom. Namely, the electrode at the side of the substrate 2a and the electrode 5 at the side of the film-like printed circuit substrate 4 are electrically connected by way of an anisotropic conductive film 6. This anisotropic conductive film 6 is a conductive film which permit conductivity only in the vertical direction in FIG. 1. Therefore, the adjacent electrodes 3 and 5 are never short-circuited through anisotropic conductive film 6.

In the wiring connection structure described above, if the film-like printed circuit substrate 4 is peeled off once from the substrate 2a at the side of the displaying cell 1 for correcting of a positional error or repair of the breaking of wire or leakage in the case that any positional error should occur between the electrode 3 of the substrate 2a at the side of the displaying cell 1 and the electrode 5 of the film-like printed circuit substrate 4, or in the case it is detected in the inspection process that the connected point is broken or the current leaks therethrough, the electrode 3 on the substrate 2a at the side of the displaying cell 1 is apt to be peeled off. Especially, as the electrode 3 is not directly formed on the substrate 2a but the electrode 3 is formed on an overcoated film comprising resin to shield the color filter in the case of a color liquid crystal display device, the electrode 3 is apt to be peeled off much more.

For this reason, even though the electrode 5 of the film-like printed circuit substrate 4 is connected onto the electrode 3 of the substrate 2a at the side of the displaying cell 1 again after correcting the positional error or repairing such a fault as breaking of wire, the reliability of the connected portion may be remarkably lowered. Conventionally, re-connection has not been carried out.

Actually however, in the case that substrates in which positional error or breaking of wire occurs in the connected portion thereof as in the conventional examples are disposed as defective substrate, the ratio of completeness of the products may be remarkably lowered, thereby causing the cost of production to be much increased.

SUMMARY OF THE INVENTION

It is therefore an object of the invention to provide a method for wiring connection of a display device and a structure for wiring connection to be used therefor, by which an electrode of a substrate at the side of a displaying cell can be re-connected to another electrode of a film-like printed circuit substrate without spoiling the reliability of connection therebetween.

The invention presents a method for wiring connection of a display device in which one or plural wiring substrates are connected to a substrate of the displaying electrode, wherein a part of a plurality of the first electrodes formed on the displaying electrode substrates and the second electrode formed on the wiring substrates and individually corresponding to each of the first electrode are electrically connected, the wiring substrates are separated from the displaying electrode substrates in the case that any abnormal condition is detected, resulting from the connection of the wiring substrates, and the second electrode of the wiring substrates is electrically connected to another part which is different from the above part of the first electrodes.

In a method for wiring connection of the display device according to the invention, a part of a plurality of the first electrodes formed on the displaying electrode substrates are electrically connected to the second substrate formed on the wiring substrates and individually corresponding to each of the first electrodes.

According to the invention, in the case that any positional error, breaking of wire or current leakage should occur between the first electrodes and the second electrode with one or plural wiring substrates connected to the displaying electrode substrates, such a wiring substrate as related to the abnormality can be separated.

At this time, the first electrodes formed on the displaying electrode substrates may be peeled off. However, thereafter, a part which is different from the part that has been previously connected of the first electrodes can be electrically connected with the second electrode on the wiring substrates. Therefore, for instance, even though a part which has been previously connected of the first electrodes is peeled off, the second electrode can be normally connected to another part that is not peeled off, in subsequent connection.

As shown in the above, according to the method for connection of the display device of the invention, as repeated connection can be effected at a part different from the previously connected part, an electrode of a film-like printed circuit substrate can be electrically connected to a part which is not peeled off on the electrode of a substrate at the side of the displaying cell in subsequent connections even though the electrode of a substrate at the side of the displaying cell is peeled off at the previously connected portion. So, the reliability of the connected portion is not lowered at all even in subsequent connections. Therefore, it will become possible to repair the connected points, thereby causing the ratio of completeness of the products to be much heightened.

The invention also presents a method for wiring connection of a display device, wherein the surface of the displaying electrode substrates and the wiring substrates, on which the first and the second electrode are formed respectively, are confronted each other and the corresponding first electrodes and second electrode are electrically connected.

The invention further presents a method for wiring connection of a display device, wherein the first and the second electrode are connected with an anisotropic conductive material.

The invention still presents a method for wiring connection of a display device, wherein the first electrodes on the displaying electrode substrates are formed through an insulating layer on the displaying electrode substrates.

The invention presents a structure for wiring connection of a display device in which one or plural wiring substrates are connected to displaying electrode substrates is characterized in that;

the displaying electrode substrates are provided with a plurality of first electrodes in which are set a plurality of connection areas which extends outwardly of the displaying area from the displaying area and which are connected with the wiring substrates along the lengthwise direction thereof, the wiring substrates are provided with a second electrode which is connected to either of the connection areas of the first electrodes, and in the case that any abnormal condition is detected in either of the wiring substrates or the displaying electrode substrates after the second electrode is connected to either of the connection areas of the first electrodes, the wiring substrates are peeled off and are connected to the other connection area.

The invention also presents a structure for wiring connection of a display device, wherein the surface of the displaying electrode substrates and the wiring substrates, on which the first and the second electrodes are formed respectively, are confronted each other and the corresponding first electrodes and second electrode are electrically connected.

The invention further presents a structure for wiring connection of a display device, wherein the first and the second electrodes are connected with an anisotropic conductive material.

The invention still presents a structure for wiring connection of a display device, wherein the first electrodes the displaying electrode substrates are formed through an insulating layer on the displaying electrode substrates.

BRIEF DESCRIPTION OF THE DRAWINGS

These and other objects of the invention, features and advantages thereof will be made more apparent from the ensuing specification and the drawing accompanied herewith.

DETAILED DESCRIPTION OF THE PREFERRED EMBODIMENTS

The preferred embodiment of the invention is described in details with reference to the drawings.

Figure 1:
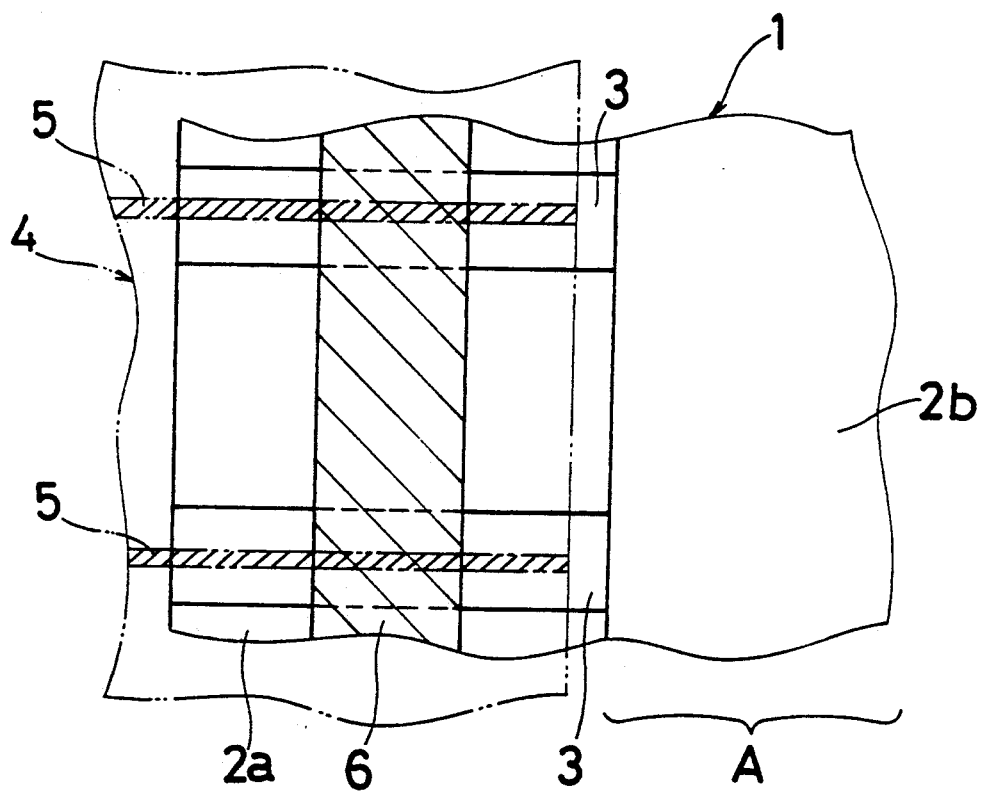
FIG. 1 is a plane view showing an enlarged part of a liquid crystal display device to which a conventional method for wiring connection applies.
Figure 2:
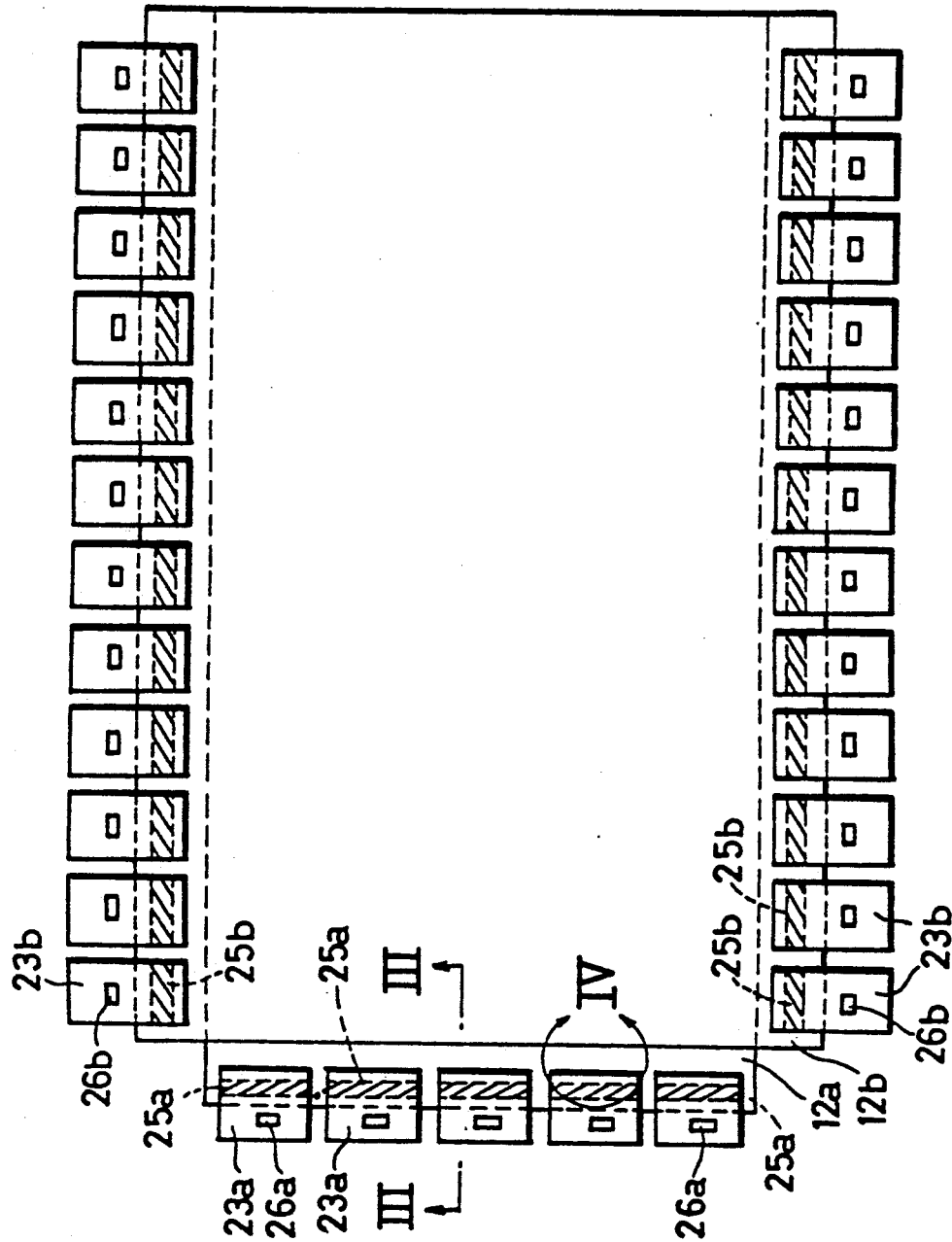
FIG. 2 is a plane view showing the outline of the composition of a color liquid crystal display device in which a method for wiring connection which is one of the preferred embodiments of the invention applies.
Figure 3:
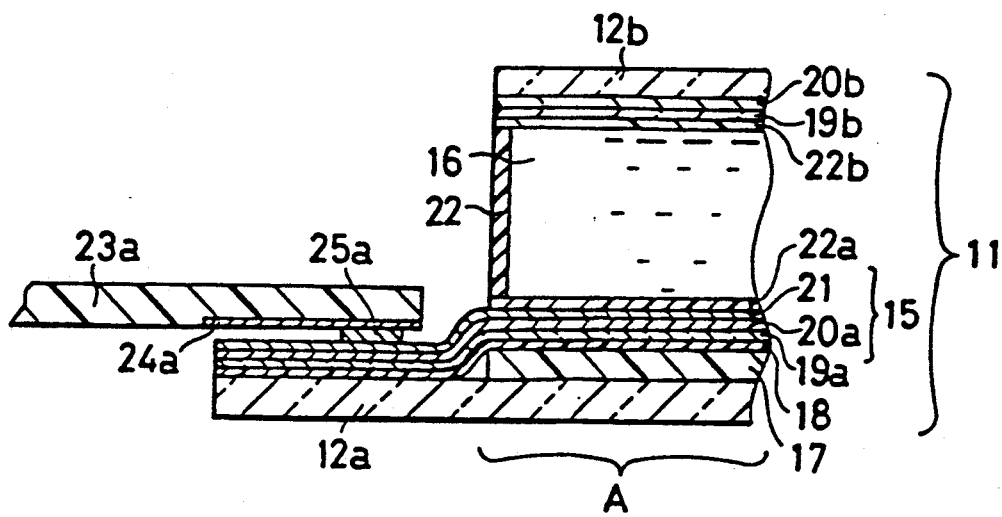
FIG. 3 is a sectional view taken along with the cut lines III—III of FIG. 2.
Figure 4:
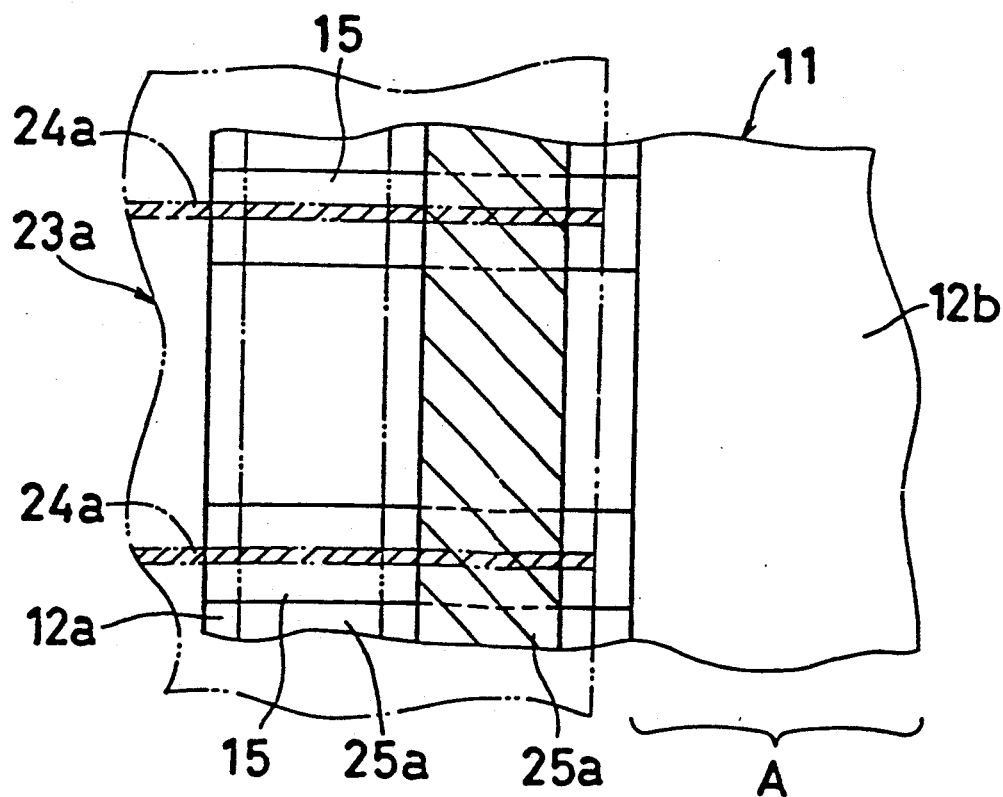
FIG. 4 is an enlarged plane view showing a part marked with "IV" in FIG. 2.

FIG. 2 is a plane view showing the outline of the composition of a color liquid crystal display device in which a method for wiring connection which is one of the preferred embodiments of the invention applies. FIG. 3 shows a sectional view taken along with the cut lines III—III of FIG. 2, and FIG. 4 is an enlarged plane view showing a part marked with "IV" in FIG. 2.

As shown in FIG. 3, the displaying cell of this color liquid crystal display device comprises a pair of glass substrates 12a and 12b confronting each other through a liquid crystal layer 16, a color filter 17 is provided on one of the glass substrates 12a, and the color filter 17 is shielded by an overcoated film 18 consisting of resin. A film 19a of oxidization such as $SiO_2$ is formed on the overcoated film 18. A transparent electrode 20a consisting ITO (Lead indium oxide) film, etc. is formed on this oxidization film 19a, and further a Mo (molybdenum) electrode 21 is formed in piles, thereby causing a common electrode 15 to be constituted. A plurality of the common electrodes 15 are so formed as to be arranged in parallel with each other on the glass substrate 12a. Then, in the displaying area A in which the above pair of glass substrates 12a and 12b are intercrossed, an orientation film 22a is formed on the front surface of the common electrode 15.

A plurality of the transparent electrodes 20b which will be a segment electrode are so formed as to be arranged in parallel with each other in such a direction as they are intercrossed with the right angle with the common electrodes 15 on the surface side confronting to the above common electrodes 15 of another glass substrate 12b. A film 19b of oxidization such as $SiO_2$ is formed on the transparent electrode 20b, and an orientation film 22b is also formed on the oxidization film 19b. A liquid crystal layer 16 is interposed between the orientation film 22a at the side of the glass substrate 12a and another orientation film 22b at the side the glass substrate 12b and is sealed by means of a sealing member 22.

The common electrode 15 at the side of the glass substrate 12a extends up to and is formed in the area in which the glass substrate 12a is overhung from the displaying area A, and the glass substrate 12b extends up to and is formed in the area which is overhung in the vertical direction on the sheet of paper of FIG. 3 from the displaying area A as well as in the transparent electrode 20b which will be a segment electrode at the side of another glass electrode 12b.

Electrodes 24a formed on such film-like printed substrates 23a as TAB and FPC are connected by way of an anisotropic conductive film 25a onto the part which extends from the displaying area A of the common electrode 15 on the glass substrate 12a of the above displaying cell 11. Chips 26a of integrated circuit (hereinafter merely called "IC") internally having peripheral circuits by which the common electrodes 15 corresponding to the displaying cells 11 are driven are mounted as shown in FIG. 2. These IC chips 26a are connected to the common electrodes 15 of the displaying cell 11 by way of the electrodes 24a and the anisotropic conductive films 25a.

The anisotropic conductive film 25a may be such that thin conductor lines are built in, for instance, rubber in parallel with the direction of thickness or may be such that thin metal particles are uniformly buried in resin and respective metal particles are insulated each other.

FIG. 4 shows a structure of connection between the electrodes 24a of the film-like printed circuit substrate 23a and the common electrode 15 on the glass substrate 12a, and the anisotropic conductive film 25a is so located that it can be intercrossed with the common electrodes 15 and is adhered thereon. In the first wiring and connection, the attaching position of the anisotropic conductive film 25a is set at the edge side of the glass substrate 12a, that is, remotely apart from the displaying area A as shown with a one-dashed line in FIG. 4. The film-like printed circuit substrate 23a is so overlapped on the glass substrate 12a that the electrode 24a thereof can be matched to the corresponding common electrodes 15, thereby causing the electrodes 15 and 24a to be connected by means of anisotropic conductive film 25a. The anisotropic conductive film 25a can permit conductivity only in the vertical direction of the sheet of paper of FIG. 4. Therefore, it is common to the prior art that the adjacent electrodes 15 and 24a are not short-circuited. In this case, at least such a spacer as to adhere another anisotropic conductive film 25a is secured between the attaching position of the anisotropic conductive film 25a and the displaying area A in the first wiring and connection.

As shown in FIG. 2, the electrodes formed on another film-like printed circuit substrates 23b are connected through an anisotropic conductive film 25b onto the transparent electrode 20b which may be a segment electrode on another glass substrate 12b. The IC chips 26b internally having peripheral circuits by which the segment electrodes (transparent electrodes 20b) corresponding to the displaying cell are driven are mounted on the film-like printed circuit substrates 23b.

In the case that any positional error should occur at the connections of the electrodes 15 and 24a as shown in FIG. 4, or in the case that it is detected in the inspection process that breaking of wire or current leakage occurs at the connections thereof, the film-like printed circuit substrate 23a is peeled off once from the connections thereof, the positional error is corrected and the breaking of wire or current leakage is repaired, and the electrode 15 and 24a are connected again by way of an anisotropic conductive film 25a. At this time, the attaching position of the anisotropic conductive film 25a on the common electrodes 15 is set to a position (shown with the oblique lines in FIG. 4) biased toward the displaying area A, avoiding the previous connected portion. Thus, in order to set a different position as distinguishing the attaching position of the anisotropic conductive film 25a in the first connection from that of the subsequent connection, this may be effected by adding a sign of each attaching position to the glass substrates 12a or forming a part of a sign showing the attaching positions on the pattern of the common electrodes 15.

In a subsequent connection, even though the common electrode 15 should be peeled off from the glass substrate 12a at the connected portion when having peeled off the film-like printed circuit substrate 23a from the previously connected portion in the case that the electrodes 15 and 24a are connected as avoiding the previously connected portion as mentioned above, a subsequent connection can be effected as avoiding the peeled off portion. Therefore, the reliability of the connected portions will be never lowered by resulting from the first peel-off of the film-like printed circuit substrate 23a.

The above connection can be effected between the segment electrodes (transparent electrode 20b) and the electrode of another film-like printed circuit substrate as well.

Also, the preferred embodiment has been described in details, picking up the case of a liquid crystal display device. This method can be applicable to other display devices as well.

The invention can be effected in other various modifications and variations without departing from the spirits and main features thereof. Therefore, the above mentioned preferred embodiment is merely an example in every aspect, and the claims of the invention are described in details in the claims attached herewith but are not restricted by the specification of the invention.

Furthermore, it can be understood that any modifications and variations which can be produced within the inventive scopes shown in the claims described hereinafter and the scope meant by the claims hereof are all included in the claims attached hereto.

What is claimed is:

1. A method for electrically connecting a display device having a displaying electrode substrate, to at least one wiring substrate, each one of the substrates having at least one electrode, comprising the steps of;
   (a) electrically connecting to a first portion of an electrode formed on the displaying electrode substrate to an electrode formed on the wiring substrate, that individually corresponds to the electrode on the displaying electrode substrate,
   (b) separating the wiring substrate from the electrode on the displaying electrode substrate in the event that any abnormality occurs, from the electrical connection of the substrates, and
   (c) electrically connecting the electrode the wiring substrates electrically to a second portion of the electrode on the displaying electrical substrate.

2. The method claimed in claim 1 wherein a surface of the displaying electrode substrate and the wiring substrate, on which the electrodes are formed, face each other and the electrodes are electrically connected to each other.

3. The method as claimed in claim 2 wherein the electrode on the wiring substrate and the electrode on the displaying electrode substrate are connected with an anisotropic conductive material.

4. A method for electrical connection of a display device as claimed in claim 1 wherein the at least one electrode on the displaying electrode substrate is formed on an oxidation film on the displaying electrode substrate.

5. A structure for electrical connection in a display device having at least one wiring substrate electrically connected to an electrode on an displaying electrode substrate comprising
   the displaying electrode substrate including a plurality of electrodes providing a plurality of connection areas that extend outwardly of a displaying area and being electrically connected with corresponding electrodes on at least one wiring substrate along the lengthwise direction thereof; and
   means for indicating the plurality of connection areas, so that when the wiring substrate is removed from the displaying electrode substrate the wiring substrate electrodes can be electrically connected to the electrodes of the displaying electrode substrate at different connection areas.

6. A structure for electrical connection of a display device as claimed in claim 5 wherein a surface of the displaying electrode substrate and the wiring substrate, on which the electrodes are formed, face each other and the electrodes of the displaying electrode substrate are electrically connected to electrodes of the wiring substrate.

7. The structure claimed in claim 6 wherein the electrodes of the displaying and wiring substrates are connected to each other with an anisotropic conductive material.

8. A structure for electrical connection of a display device as claimed in claim 5 wherein the electrode on the displaying electrode substrate is formed on an oxidation film on the displaying electrode substrate.

9. The method of claim 1, wherein there are a plurality of wiring substrates.

10. The method of claim 9, wherein there are a plurality of displaying electrode substrates.

11. The method of claim 1, further comprising the step of:
 (d) repairing the abnormality after step (b) and before step (c) is performed.

12. A method for making an electrical connection of a wiring substrate to a displaying substrate, wherein each one of said substrates includes a plurality of electrodes, and each of said electrodes of one substrate being connectable to corresponding electrodes of the other substrate comprising the steps of:
 (a) electrically connecting the electrodes of the wiring substrate to corresponding electrodes of the displaying substrates at a first position;
 (b) separating the wiring substrate from the displaying substrate when there is a fault in the electrical connection between the substrates; and
 (c) electrically reconnecting the electrodes of the wiring substrate to the displaying substrate at a second position that is different from the first position in step (a).

13. The method of claim 12 further comprising the step of:
 (d) repairing the fault after step (b) and before step (c).

14. A method of electrically connecting a plurality of electrodes on a wiring substrate to corresponding electrodes on another substrate for use in a display apparatus comprising the steps of:
 (a) electrically connecting the electrodes on the wiring substrate to a first portion of the electrodes on another substrate;
 (b) detecting a fault in the connection made after step (a);
 (c) removing the wiring substrate connection made in step (a);
 (d) repairing the fault; and
 (e) electrically reconnecting the electrodes on wiring substrate to a second portion of the electrodes on another substrate.

15. The method of claim 14, wherein the second portion is located closer to a display cell than the first portion.

16. The method of claim 14, wherein anisotropic material is used in steps (a) and (e).

17. The apparatus of claim 5 wherein the means is indicia on the displaying electrode substrate.

18. The apparatus of claim 5 wherein the means is indicia on at least one of the electrodes on the displaying electrode substrate.

* * * * *